United States Patent [19]

Ohta et al.

[11] Patent Number: 5,260,588
[45] Date of Patent: Nov. 9, 1993

[54] LIGHT-EMITTING DIODE ARRAY

[75] Inventors: Hirokazu Ohta, Miyamae; Tadao Kazuno; Naoki Shibata, both of Midori; Teruo Sasagawa, Miyamae, all of Japan

[73] Assignee: Eastman Kodak Company, Rochester, N.Y.

[21] Appl. No.: 868,403

[22] Filed: Apr. 14, 1992

[30] Foreign Application Priority Data

May 21, 1991 [JP] Japan ................... 3-116132

[51] Int. Cl.⁵ ........................... H01L 33/00
[52] U.S. Cl. ........................ 257/93; 257/95; 257/623; 257/96
[58] Field of Search ............... 257/95, 93, 88, 623, 257/96; 372/48

[56] References Cited

U.S. PATENT DOCUMENTS

| | | | |
|---|---|---|---|
| 4,236,122 | 11/1980 | Cho et al. | 257/623 |
| 4,719,497 | 1/1988 | Tsai | 257/96 |
| 4,788,159 | 11/1988 | Smith | 372/48 |
| 4,984,035 | 1/1991 | Kanzawa et al. | 257/93 |
| 5,055,893 | 10/1991 | Sasagawa | 257/88 |
| 5,103,270 | 4/1992 | Sato et al. | 257/96 |
| 5,196,718 | 3/1993 | Sasagawa | 257/96 |

FOREIGN PATENT DOCUMENTS 58-56370  4/1983  Japan ................... 257/93

*Primary Examiner*—Andrew J. James
*Assistant Examiner*—Courtney A. Bowers
*Attorney, Agent, or Firm*—Raymond L. Owens

[57] ABSTRACT

The present invention, which is directed to a light-emitting diode array for use as the light source in optical printers and other such applications, provides improved optical efficiency and a more uniform distribution of emission intensity. The light-emitting diodes are formed as reverse mesas with a mirrored sloping surface that reflects light in the direction of the light emitting surface of the diode. This improves the emission efficiency of each diode. In addition, this also increases the light output from the edge portions of light-emitting surfaces of the diodes so as to produce a more uniform distribution of light output from the light-emitting diodes.

9 Claims, 5 Drawing Sheets

POSITION ACROSS MESA

LIGHT-EMITTING DIODE ARRAY

FIELD OF THE INVENTION

The present invention relates to a light-emitting diode array, and, more particularly, to a light-emitting diode array light source for optical printer applications that has improved optical efficiency.

BACKGROUND OF THE INVENTION

In recent years there is a growing need for printers able to print faster and at higher print densities. Laser printers, which employ a laser light source, and LED (light-emitting diode) printers, which employ an LED array as the light source, are two examples of printers used in response to such needs. While a laser printer requires the use of a mechanical mechanism, such as a rotating polygonal mirror, for the scanning laser beam, an LED printer only requires that the light-emitting diodes (hereinafter also referred to as "light-emitting elements") of the light-emitting diode array be electrically controlled. LED printers do not have any mechanical moving parts and can thus be made smaller, faster and more reliable than laser printers.

FIG. 1 is a cross-sectional view of a conventional (prior art) LED array 10 used as a light source of an LED printer. LED array 10 comprises a substrate 14 of n-type conductivity GaAs having a pair of opposed surfaces 16 and 18. A layer 20 of n-type conductivity GaAsP about 80 microns thick is on the surface 16 of the substrate 14. Spaced apart diffused regions 22 of p-type conductivity are in the layer 20. The diffused regions 22 are about 1.5 microns deep. A masking layer 24 of $SiN_x$ is on the layer 20 and has openings 26 therethrough exposing the diffused regions 22. A separate conductive electrode 28 is on each of the diffused region 22, and a conductive electrode 30 is on the surface 18 of the substrate 14. An anti-reflection layer 32 of $SiN_x$ is over the masking layer 24, electrodes 28, and the exposed surfaces of the diffused regions 22. Each of the diffused regions 22 forms with the layer 20 a separate light-emitting element 12. Only two light-emitting elements 12 are shown. A p-n junction 34 between each of the diffused region 22 and the layer 20 is an emission region.

The LED array 10 is made by first depositing the GaAsP layer 20 on the surface 16 of the substrate 14 using vapor phase epitaxy (VPE). The masking layer 24 is then deposited on the layer 20 and is defined using standard photolithographic techniques and etching, to form the openings 26. The diffused regions 22 are then formed by diffusing a p-type conductivity dopant, such as zinc, into the layer 20 through the openings 26 in the masking layer 24. The electrodes 28 and electrode 30 are then formed by deposition and alloying. Finally, the anti-reflection layer 32 is deposited.

For application as a light source of a printer, the qualities generally required of an LED array are a high emission efficiency and uniform intensity of the emitted light. In the case of the conventional (prior art) LED array 10, the GaAsP layer 20 has a high internal absorption and there are high-density lattice defects caused by a lack of lattice matching between the GaAsP of the layer 20 and the n-type GaAs of the substrate 14. Also, the material itself has low emission efficiency and considerable non-uniformity. Moreover, the light-emitting region is a p-n homojunction, which from the standpoint of emission efficiency, is not the most suitable type to use for light source applications. A further problem is that of blurred printing caused by the fact that the intensity of the emitted light within the element declines in proportion to the increase in the distance from the electrodes.

Referring to FIG. 2, there is shown a cross-sectional view of a conventional (prior art) AlGaAs single heterojunction type light-emitting diode array 36 which overcomes the drawbacks of the conventional GaAsP light-emitting diode array 10. The diode array 36 comprises a substrate 38 of p-type conductivity GaAs having a pair of opposed surfaces 40 and 42. A first layer 44 of p-type conductivity $Al_xGa_{1-x}As$ is on the surface 40 of the substrate 38. The first layer 44 is about 10 microns thick and is doped with zinc to a concentration of $5 \times 10^{17}$ impurities/cm$^3$. A second layer 46 of n-type conductivity $Al_yGa_{1-y}As$ is on the first layer 44. The second layer 46 is about 5 microns thick and is doped with Te to a concentration of $8 \times 10^{17}$ impurities/cm$^3$. For emitting light with a wavelength of 720 nm, the aluminum concentration in the first and second layers 44 and 46 is $x=0.2$ and $y=0.5$ respectively. Spaced grooves extend through the second layer 46 and a portion of the first layer 44 to form mesas 48, each of which forms a light-emitting element.

A third layer 50 of n+type conductivity GaAs is on a portion of the second layer 46 of each of the mesas 48. The third layer 50 is about 0.1 microns thick and is doped with Sn to a concentration of $5 \times 10^{18}$ impurities/cm$^3$. A separate electrode 52 is on the third layer 50 of each mesa 48, and an electrode 54 is on the surface 42 of the substrate 38. An anti-reflection coating 56 is over each of the mesas 48 and the portion of the first layer 44 between the mesas 48.

The array 36 is made by first depositing the first layer 44 on the surface 40 of the substrate 38 using liquid-phase epitaxy (LPE). This is followed by the deposition of the second layer 46 on the first layer 44, and the material of the third layer 50 on the second layer 46. The material of the electrode 52 is then deposited on the third layer 50 and the electrode 54 is deposited on the surface 42 of the substrate 38.

The electrodes 52 are then defined using photolithography and plasma etching. Using the electrodes 52 as a mask, the exposed portions of the material of the third layer 50 are then removed to form the third layer 50 under each of the electrodes 52. The third layer 50 is etched with $NH_4OH:H_2O_2 = 1:10$.

$H_2SO_4:H_2O_2:H_2O = 1:2:40$ chemical etching is then used to form the grooves through the second layer 46 and about one micron into the first layer 44. This forms the mesas 48 which are the light-emitting elements. The orientation of the substrate is taken into account to ensure that the shape of each mesa 48 is such that the portion adjacent the electrode 52 is in the reverse mesa direction, i.e., the sides of the mesa taper inwardly in the direction away form the electrode 52. The portion of the mesa 48 away from the electrode 52 is in a forward mesa direction. The fabrication process is then completed by using plasma CVD (chemical vapor deposition) to form an anti-reflection $SiN_x$ coating 56, followed by alloying to form ohmic contacts between the electrodes 52 and 54 and the third layer 50 and substrate 38 respectively.

Thus, structurally, this is an array of discrete high-luminance LEDs. This arrangement suppresses optical energy attenuation caused by internal absorption by using the $Al_yGa_{1-y}As$ second layer 46, which is transparent to light emitted by the $Al_xGa_{1-x}As$ first layer 44. Also, as well as using a junction with good epitaxial matching characteristics, the heterojunction improves the carrier injection efficiency and results in an overall external output efficiency that is several times higher than that of the light-emitting diode array 10 shown in FIG. 1.

However, unlike the coherent light of a laser, LEDs emit light in all directions. One problem with the array 36 is that light emitted toward the substrate 38 is absorbed. This results in a corresponding loss of external output. Light travelling horizontally and impinging on the sloping surface of the mesas 48 is lost by being scattered or absorbed by this sloping surface. Thus, the only light that is emitted to the exterior is the light directed toward the LED surface. This limits the external output efficiency to values of no more than several percent.

SUMMARY OF THE INVENTION

The present invention is directed to a light-emitting diode array that has a high external output efficiency and a highly uniform distribution of light emission intensity within the LED elements.

In accordance with the present invention this is attained with a light-emitting diode which comprises a substrate having a pair of opposed surfaces with an active layer of a semiconductor material on one of the surfaces of the substrate. The active layer is of a material which is capable of having light generated therein. A reverse mesa is formed in the active layer and has at least one inwardly sloping side surface. The sloping side surface is at an angle which is capable of reflecting light directed thereat through the active layer to an emitting surface of the diode.

The invention will be better understood from the following more detailed description taken with the accompanying drawings and the claims.

The drawings are not necessarily to scale.

DETAILED DESCRIPTION

Figure 3:
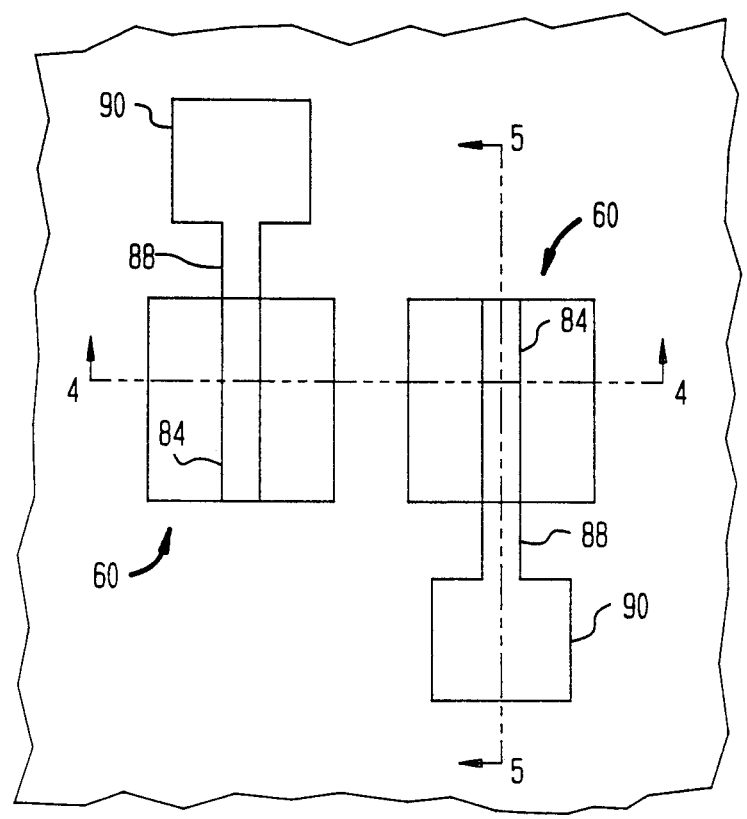
FIG. 3 is a top plan view of a light-emitting diode array in accordance with the present invention.
Figure 4:
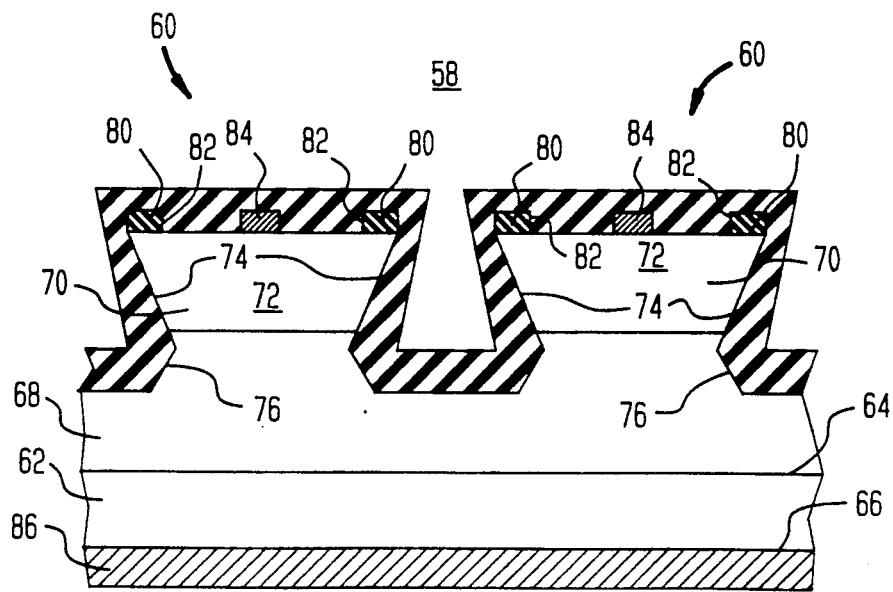
FIG. 4 is a cross-sectional view taken along line 4—4 of FIG. 3.
Figure 5:
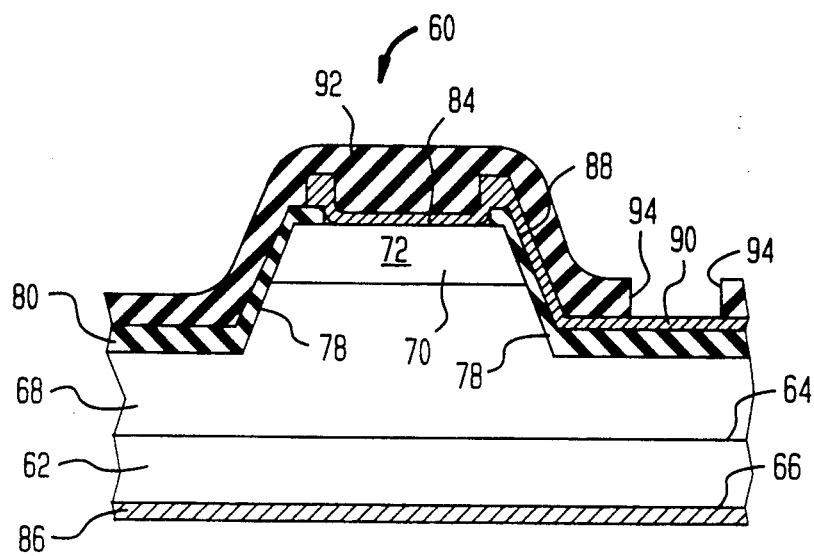
FIG. 5 is a cross-sectional view taken along line 5—5 of FIG. 3.

Referring now to FIGS. 3, 4 and 5, there are shown a top plan view, a first cross-sectional view through a dashed line 4—4 of FIG. 3, and a second cross-sectional view through a dashed line 5—5 of FIG. 3, respectively, of an AlGaAs light-emitting diode array 58 in accordance with the present invention. The light-emitting diode array 58 comprises a substrate 62 having opposed surfaces 64 and 66. The substrate 62 is of p-type conductivity GaAs which is doped with Zn to a concentration of $1 \times 10^{18}$ impurities/$cm^3$. On the surface 64 of the substrate 62 is a first layer 68 of p-type conductivity AlGaAs. The first layer 68 is about 10 microns in thickness and is doped with Zn to a concentration of $1 \times 10^{18}$ impurities/$cm^3$. A second layer 70 of n-type conductivity GaAlAs is on the first layer. The second layer 70 is an active layer and is of a material which is capable of having light generated therein, and is about 5 microns thick and is doped with Si to a concentration of $1 \times 10^{18}$ impurities/$cm^3$ Grooves extend through the second layer 70 and a portion of the first layer 68 to form reverse mesas 72, each of which is a light-emitting element 60. For simplicity, only two light-emitting elements 60 are shown.

As is shown in FIG. 4, each of the mesas 72 has a pair of opposed inwardly sloping mirror side surfaces 74 which crosses the junction between the first and second layers 68 and 70 and a neck portion 76 within the first layer 68. An inwardly sloping surface is a surface which extends inwardly from the top of the mesa 72 toward the substrate 62 and under the top of the mesa 72. The surfaces 74 are at an angle of 45° with respect to the first and second layers 68 and 70. As shown in FIG. 5, each of the mesas 72 has a pair of opposed surfaces 78 which slope outwardly, i.e., a surface which extends away from the top of the mesa 72 but in the reverse direction of an inwardly sloping surface.

An insulating layer 80 of $SiN_x$ is on the second layer 70 of each mesa 72, the outwardly sloping surfaces 78 of each mesa 72 and the surface of the first layer 68 between the mesas 72. The insulating layer 80 has an opening 82 therethrough to expose a portion of the second layer 70 of each mesa 72. A conductive electrode 84 is on the second layer 70 of each mesa 72 and a conductive electrode 86 is on the surface 66 of the substrate 62. As is shown in FIGS. 3 and 5, each of the electrodes 84 is a strip which extends across the second layer 70 and has a feed-through 88 which extends over the outwardly sloping surface 78 to an electrode pad 90. As shown in FIG. 4, a layer 92 of an insulating material, such as $SiN_x$, extends over the mesas 72. As shown in FIG. 5, the insulating layer 92 has an opening 94 therethrough over the electrode pad 90 to allow a terminal wire to be connected to the electrode pad 90.

To make the array 58, liquid-phase epitaxy (LPE) is used to deposit the first layer 68 on the surface 64 of the substrate 62. This is followed by the deposition of the second layer 70 on the first layer 68. Plasma CVD is then used to form an insulating $SiN_x$ layer over the whole surface and photolithography and dry etching are used to remove the $SiN_x$ layer except for the portion over the areas which are to form the mesas 72. Using the remaining $SiN_x$ as a mask, portions other than the mesas 72 are etched away using $H_2SO_4:H_2O_2:H_2O$ chemical and dry etching extending several microns into the first layer 68 to obtain a reverse mesa configuration. The composition of the etching fluid and the etching depth are adjusted so that a p-n junction between the first and second layers 68 and 70 is higher than the neck portion 76 of the reverse mesa 72. Also, during dry etching the angle of the substrate is controlled to give the sloping surface of the reverse mesa an angle of substantially 45 degrees relative to the layers 68 and 70. Plasma CVD is then used to form the insulating $SiN_x$ layer 80 over the whole surface and photolithography and plasma etching are then used to form the openings 82 therethrough. Photolithography and vapor deposition are then used to form the electrodes 84, feedthroughs 88 and electrode pads 90. Plasma CVD is used to form the insulating $SiN_x$ layer 92, and vapor deposition is used to form the electrode 86 on the surface 66 of the substrate 62. Finally, alloying is used to form ohmic contacts for the electrodes 84 and 86, and photolithography and plasma etching are used to form the opening 94 in the $SiN_x$ layer 92 over the pads 90.

Figure 6:
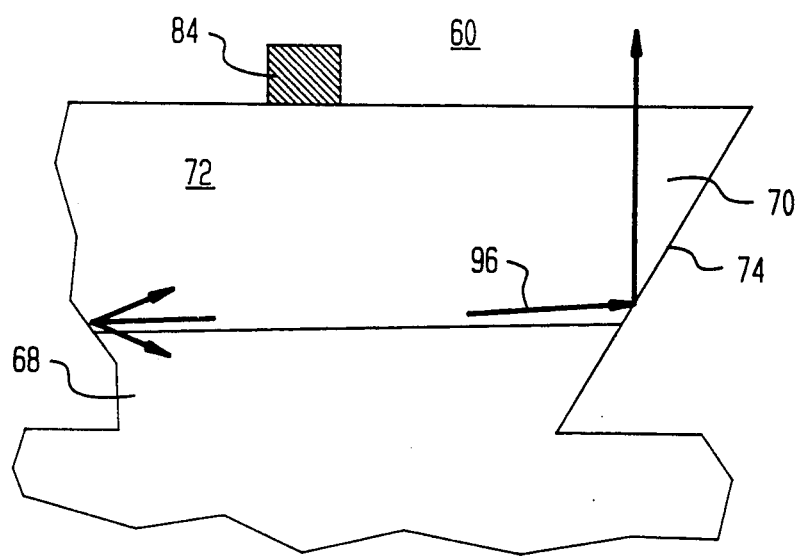
FIG. 6 is a cross-sectional view that illustrates the working of a mirror surface of each of the light-emitting diodes of the present invention.

Referring now to FIG. 6, there is shown a cross-sectional view of one light-emitting element 60 of the light-emitting diode array 58 of FIG. 3 which illustrates the light emission from the element 60. Light generated in the second layer 70 (the active layer) and radiating to the side, as indicated by the arrow 96, is reflected to the surface of the second layer 70 by the sloping mirror surface 74 of the reverse mesa 72 where the light is emitted from the element 60. This improves the emission efficiency of the light-emitting element 60. In addition, the increase in the amount of the light emitted externally from the edge portions of the light-emitting element 60 produces a uniform distribution of light-emitting intensity within the light-emitting elements 60.

Figure 1:
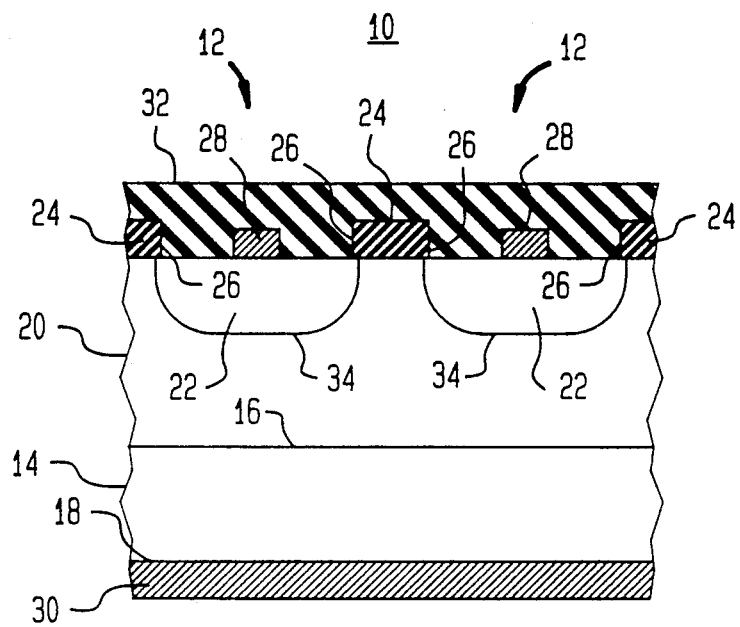
FIG. 1 is a cross-sectional view of a conventional (prior art) light-emitting diode array.
Figure 2:
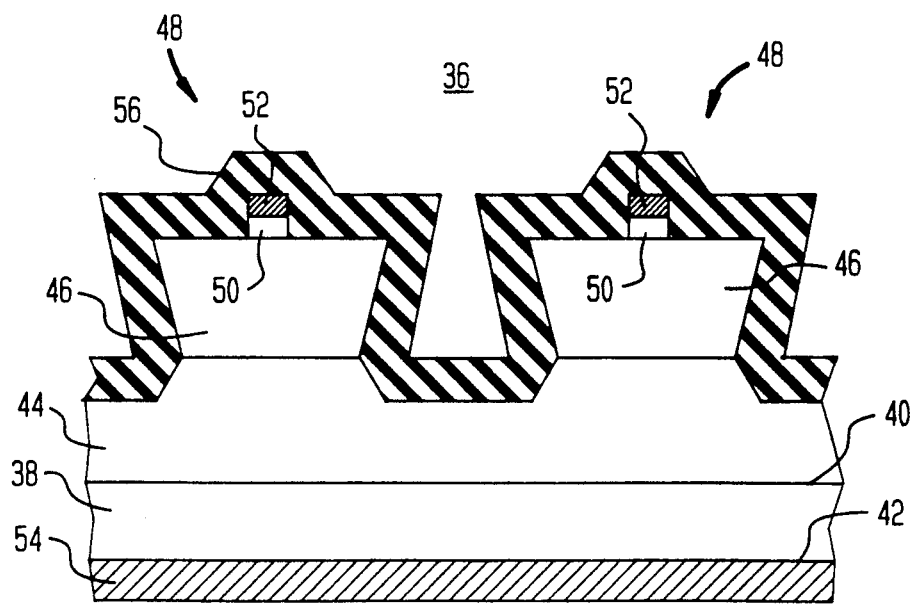
FIG. 2 is a cross-sectional view of another conventional (prior art) light-emitting diode array.
Figure 7:
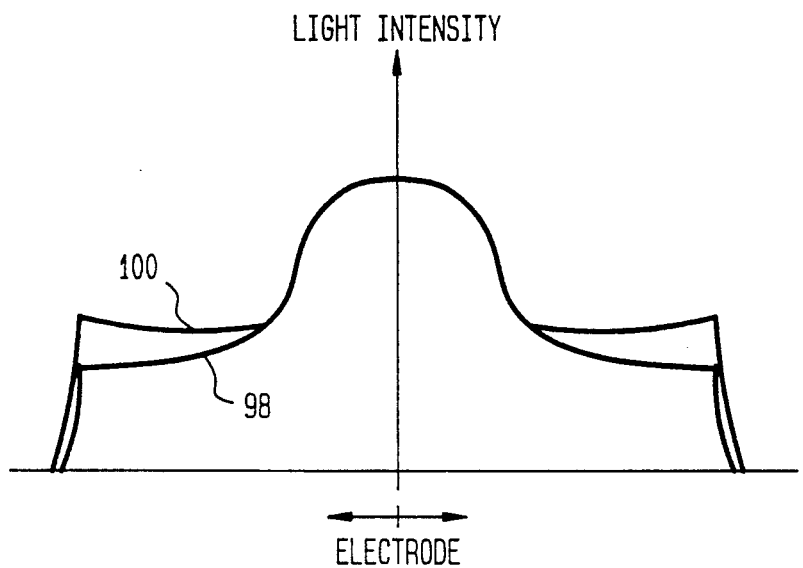
FIG. 7 is a graph showing and comparing the spatial distribution of the intensity of light emitted by a light-emitting diode array in accordance with the present invention and a conventional (prior art) light-emitting diode array.

Referring now to FIG. 7, there is shown a graph containing a line 100 illustrating spatial distribution of the intensity of light emitted by one of the light-emitting elements 60 of FIG. 6 constituting the light-emitting diode array 58 of FIG. 3. The graph also contains a line 98 illustrating spatial distribution of the intensity of light emitted by a conventional (prior art) light-emitting element such as element 10 of FIGS. 1 and 2. The ordinate is light intensity and the abscissa is the position across the mesa 72 with the position of the electrode 84 being at the center. The intensity of the light in the conventional element 10 of FIG. 1 decreases in intensity with the increase in distance from the electrode. However, the intensity distribution of the light obtained in the light-emitting element 60 of the present invention, as indicated by line 100, shows better uniformity than the conventional element. This results from the additional light emitted from the peripheral edge portions.

Figure 8:
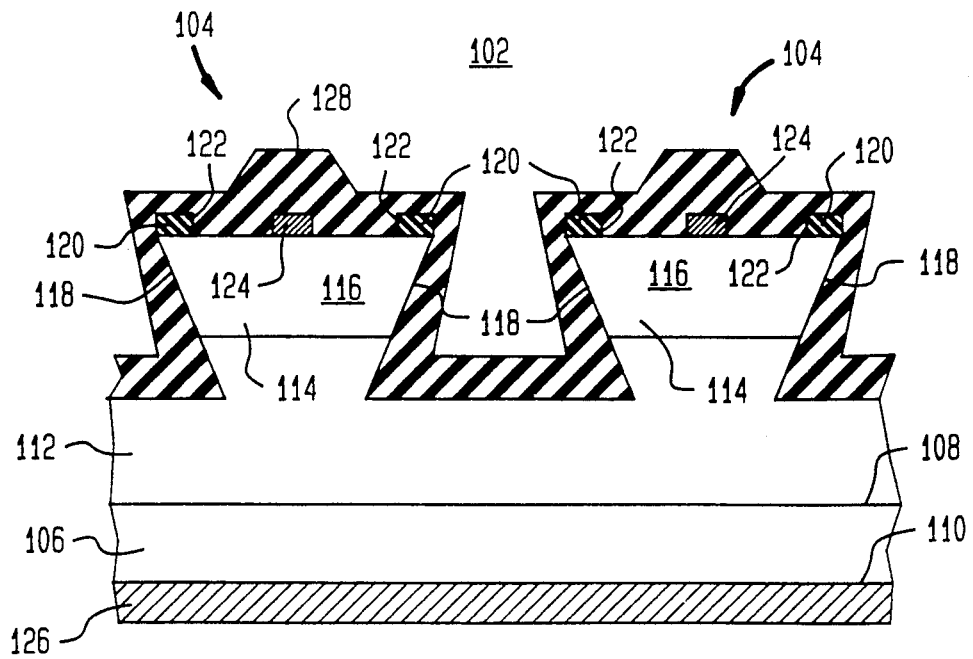
FIG. 8 is a cross-sectional view of another light-emitting diode array in accordance with the invention.

Referring now to FIG. 8, there is shown a cross-sectional view of a GaAsP light-emitting diode array 102 in accordance with the invention. The light-emitting diode array 102 comprises a substrate 106 having a pair of opposed surfaces 108 and 110. The substrate 106 is of n-type conductivity GaAs which is doped with Si to a concentration of $1 \times 10^{18}$ impurities/cm$^3$. A layer 112 of n-type conductivity GaAsP is on the surface 108 of the substrate 106. The layer 112 is about 80 microns in thickness. A p-type conductivity layer region 114 is in the layer 112 to a depth of about 2 microns. The layer region 114 is the active layer of the diode element 102. Grooves extend through the region 114 and into the layer 112 to form reverse mesas 116, each of which is a light-emitting element 104. For simplicity, only two light-emitting elements 104 are shown. Each of the mesas 116 has inwardly sloping side surfaces 118 which form mirrors.

A masking layer 120 of $SiN_x$ is on the region 114 of each mesa 116 and has an opening 122 therethrough to expose a portion of the surface of the region 114. An electrode 124 is on a portion of the surface of the region 114 of each mesa 116, and an electrode 126 is on the surface 110 of the substrate 106. An insulating layer 128 of $SiN_x$ is over the mesas 116 and the electrodes 124. The insulating layer 128 has openings (not shown) therethrough to expose the pads (not shown) of the electrodes 124.

To make the light-emitting diode array 102, VPE is used to deposit the layer 112 on the surface 108 of the substrate 106. A p-type conductivity dopant, such as zinc, is then diffused into the layer 112 to form the region 114. Plasma CVD is then used to form a $SiN_x$ masking layer 120 on the zinc diffused region 114. This is followed by the use of photolithography and plasma etching to fabricate openings in the masking layer 120 where the grooves are to be formed. Then chemical etching and dry etching are used to produce the reverse mesas 116, and to provide the sloping surfaces 118 thereof with a mirror surface. Photolithography and vapor deposition are then used to form electrodes 124 and 126. Plasma CVD is used to form a $SiN_x$ insulating layer 128 over the whole surface and alloying is used to form ohmic contacts. Finally, photolithography and plasma etching are used to form electrode pads by removing the $SiN_x$ layer from the pad portions.

In the light-emitting diode array 102, the interface of the zinc-diffused layer region 114 and the layer 112 is substantially at 45 degrees to the sloping surface 118 of the reverse mesa 116. Thus, light travelling horizontally from the region 114, which serves as an active layer, is reflected toward the emission surface of the element 104, thereby increasing the external output efficiency. Furthermore, the emission of the reflected light from the edge portions of the emission surface of the elements 104 produces a uniform distribution of light-emitting intensity within the light-emitting elements 104.

Figure 9:
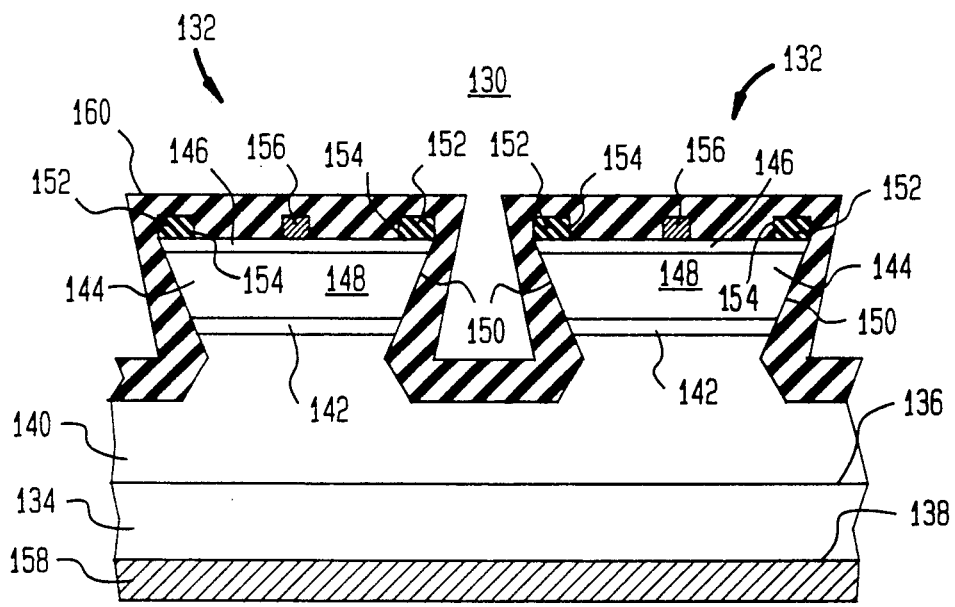
FIG. 9 is a cross-sectional view of a still another light-emitting diode array in accordance with the present invention.

Referring now to FIG. 9, there is shown a cross-sectional view of an AlGaAs double heterojunction LED array 130 in accordance with the present invention. The array 130 comprises a substrate 134 having opposed surfaces 136 and 138. The substrate 134 is of n-type conductivity GaAs doped with Si to a concentration of $1 \times 10^{18}$ impurities/cm$^3$. On the surface 136 of the substrate 134 is a first layer 140 of n-type conductivity AlGaAsP of a thickness of about 2 microns. A second layer 142 of p-type conductivity GaAs is on the first layer 140 and serves as the emission layer of the element 132. A third layer 144 of p-type AlGaAs is on the second layer 142 and serves as a cladding layer. Finally, a fourth layer 146 of p+ type conductivity AlGaAs is on the third layer 144 and serves as a contact layer. Grooves extend through the fourth layer 146, the third layer 144, the second layer 142 and partially through the first layer 140 to form the reverse mesas 148 which each form a light-emitting element 132. For simplicity, only two of the light-emitting elements 132 are shown. Each of the mesas 148 has inwardly sloping surfaces 150 which extend across the emission second layer 142 to provide mirror surfaces.

A masking layer 152 of $SiN_x$ is on the fourth contact layer 146 of each mesa 148 and has an opening 154 therethrough to expose a portion of the fourth layer 146. An electrode 156 is on a portion of the fourth layer 146 of each mesa 148 and an electrode 158 is on the surface 138 of the substrate 134. An insulating layer 160 of $SiN_x$ covers the mesas 148.

To make the light-emitting diode array 130, LPE is used to deposit the first layer 140 on the surface 136 of the substrate 134. This is followed by the deposition in succession of second layer 142, the third layer 144 and the fourth layer 146. Plasma CVD is then used to form the SiN$_x$ masking layer 152. Photolithography and plasma etching are used to form openings in the masking layer 152 where the grooves are to be formed. Chemical etching and dry etching are then used to form the reverse mesas 148, and to provide the sloping surfaces 150 thereof with a mirror surface. Photolithography and vapor deposition are then used to form the electrodes 156 and 158. Plasma CVD is used to form the SiN$_x$ insulating layer 160 over the whole surface and alloying is used to form ohmic contacts. Finally, photolithography and plasma etching are used to form electrode pads (not shown) by removing the SiN$_x$ insulating layer 160 from the pad portions.

In the light-emitting diode array 130, light travelling horizontally from the active second layer 142 is reflected toward the emission surface by the mirror sloping surface 150 of the mesa 148. This increases the external output efficiency of the light-emitting elements 132. Also, this increases the amount of external light emission from the edge portions of the light-emitting elements 132 so as to produce a uniform distribution of light-emitting intensity within the light-emitting elements 132.

It is to be appreciated and understood that the specific embodiments of the invention are merely illustrative of the general principles of the invention. Various modifications may be made consistent with the principles set forth. For example, although the foregoing descriptions of the light-emitting diode arrays have been made with reference to specific thicknesses and materials of the group III–V compounds and alloys thereof, such as GaAsP, AlGaAs and GaAs, it is to be understood that the invention is not limited thereto. Any semiconductor material may be used which enables a carrier confinement effect to be obtained by the use of various compositions. Still further, the invention is not limited to the use of LPE, but may employ other epitaxial processes, such as, for example, metal-organic chemical vapor deposition, molecular beam epitaxy and liquid-phase CVD.

What is claimed is:

1. A light-emitting diode comprising:
   a substrate having a pair of opposed surfaces;
   an active layer of a semiconductor material on one of the surfaces of the substrate, said active layer being capable of having light generated therein;
   a reverse mesa formed in said active layer having a pair of opposed inwardly sloping surfaces which are at an angle of 45° with respect to the active layer, such surfaces being capable of reflecting light directed thereto through the active layer to an emitting surface of the diode.

2. An array of light-emitting diodes comprising:
   a substrate of a semiconductor material having a pair of opposed surfaces;
   a plurality of spaced reverse mesas on one of the surfaces of the substrate, each of the mesas being a light-emitting diode and comprising:
   an active layer of a semiconductor material which is capable of generating light therein; and
   a pair of opposed inwardly sloping surfaces which are at an angle of 45° with respect to the active layer and extend across the active layer, such surfaces being capable of reflecting light directed thereto through the active layer to an emitting surface of the mesa.

3. The array of claim 2 in which each of the arrays further comprises a first layer of a semiconductor material of one conductivity type on the one surface of the substrate and a second layer of a semiconductor material of the opposite conductivity type on the first layer and forming the active layer, each of the mesas includes the second layer and a portion of the first layer with the sloping surfaces of the mesas extending across the junction between the first and second layers.

4. The array of claim 3 in which the substrate and each of the layers is of a group III–V semiconductor material or an alloy thereof.

5. The array of claim 4 in which the first and second layers are of the same semiconductor material.

6. The array of claim 5 in which the second layer is a diffused region in the first layer.

7. The array of claim 3 further comprising a conductive electrode on a portion of the second layer of each mesa and a conductive electrode on the other surface of the substrate.

8. The array of claim 3 further comprising a third layer of a semiconductor material of the opposite conductivity type on the second layer of each mesa.

9. The array of claim 8 further comprising a conductive electrode on a portion of each of the third layers of each mesa and a conductive electrode on the other surface of the substrate.

* * * * *